US006493089B2

(12) United States Patent
Numai

(10) Patent No.: US 6,493,089 B2
(45) Date of Patent: *Dec. 10, 2002

(54) GYRO AND METHOD OF OPERATING THE SAME WITH A MODULATED FREQUENCY SIGNAL

(75) Inventor: Takahiro Numai, Ninomiya-machi (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/419,781

(22) Filed: Oct. 18, 1999

(65) Prior Publication Data

US 2002/0033950 A1 Mar. 21, 2002

(30) Foreign Application Priority Data

Oct. 19, 1998 (JP) .......................................... 10-296580
Jul. 30, 1999 (JP) .......................................... 11-216140

(51) Int. Cl.[7] ............................................. G01C 19/66
(52) U.S. Cl. ....................................................... 356/461
(58) Field of Search ............................... 356/459, 461; 372/94

(56) References Cited

U.S. PATENT DOCUMENTS

| 4,327,982 A | * | 5/1982 | Redman ..................... 356/459 |
| 4,431,308 A | | 2/1984 | Mitsuhashi et al. ......... 356/459 |
| 4,820,008 A | * | 4/1989 | Malvern ..................... 356/459 |
| 4,913,548 A | | 4/1990 | Vick ........................... 356/459 |

FOREIGN PATENT DOCUMENTS

| JP | 62-39836 | 8/1987 |
| JP | 63-250514 | 10/1988 |
| JP | 4-174317 | 6/1992 |
| JP | 5-288556 | 11/1993 |
| JP | 6-38529 | 5/1994 |
| JP | 6-140364 | 5/1994 |
| JP | 7-131123 | 5/1995 |
| JP | 7-146150 | 6/1995 |
| JP | 60-148185 | 8/1995 |
| JP | 8-18166 | 1/1996 |
| JP | 8-125251 | 5/1996 |

OTHER PUBLICATIONS

English translation of "Explanatory Notes of Reference Numbers Appearing in Figure 8" of Japanese Application No. 07–146150, published Jun. 1995, and Figure 8.

* cited by examiner

Primary Examiner—Samuel A. Turner
(74) Attorney, Agent, or Firm—Fitzpatrick, Cella, Harper & Scinto

(57) ABSTRACT

An optical gyro reduces the coupling loss produced when a laser beam is incident upon a photodetector and the noise generated by the laser beam returning to the laser from an external point of reflection. The gyro includes a ring resonator type semiconductor laser for having laser beams transmitted circularly in opposite directions relative to each other. The angle $\alpha$ formed by the surface of the active layer of the semiconductor laser and the lateral surface of each of the low refractive index layers sandwiching the active layer and showing a refractive index lower than the active layer satisfies the requirement of $75° < \alpha < 105°$ over the entire periphery of the low refractive index layer. The gyro detects a beat signal generated in the semiconductor laser.

17 Claims, 15 Drawing Sheets

406
422
401
423
407

GYRO AND METHOD OF OPERATING THE SAME WITH A MODULATED FREQUENCY SIGNAL

BACKGROUND OF THE INVENTION

1. Field of the Invention

This invention relates to a gyro and a method of operating the same. More particularly, the present invention relates to a gyro comprising a ring resonator type laser.

2. Related Background Art

Mechanical gyros comprising a rotor and a vibrator and optical gyros adapted to detect the angular velocity of a moving object are known. Particularly, optical gyros are regarded as real innovation because they can start to operate instantaneously and provide a wide dynamic range. Optical gyros include ring resonator type laser gyros, optical fiber gyros and passive type ring resonator gyros, of which ring resonator type laser gyros comprising a gas laser were developed most early and have been used in aeronautic applications and other applications. Recently, small, high precision, ring resonator type laser gyros have been proposed and Japanese Patent Application Laid-Open No. 5-288556 describes such a gyro.

However, known ring resonator type laser gyros are so designed that a laser beam propagating clockwise and another laser beam propagating counterclockwise are once emitted therefrom to the outside and received by a photodetector, which transforms their optical beat into electric beat as signal. This means that a coupling loss arises when the laser beams enter the photodetector. Additionally, known ring resonator type laser gyros need an optical isolator in order to avoid the noise generated by the beams returning from an external point of reflection to the laser.

Japanese Patent Application Laid-Open No. 4-174317 describes a technique of observing the angular velocity of an object by causing a pair of laser beams to be transmitted circularly clockwise and counterclockwise within the semiconductor laser and utilizing the beat produced by the interference of the laser beams.

A laser device described in the above cited patent document will be described by referring to FIGS. 34 and 35 of the accompanying drawings. FIG. 34 is a schematic plan view of the device and FIG. 35 is a schematic cross sectional view taken along line 35—35 in FIG. 34. Referring to FIGS. 34 and 35, there are shown an InP substrate 10, ridge type optical waveguides 11, 12A, 12B and 12C, total reflection corner mirrors 13A, 13B, 13C and 13D arranged at the four corners, a voltage detection terminal 14 and a bias current supply terminal 15. The total reflection corner mirrors are formed, as shown in FIG. 35, by engraving the surface using an etching technique.

However, the technique described in the above cited patent document cannot provide a high yield when manufacturing such devices on a commercial basis. Further, there is a strong demand for laser devices of the type under consideration that can oscillate with a lower driving power. This invention is made under these circumstances.

SUMMARY OF THE INVENTION

Therefore, it is a first object of the present invention to provide a gyro comprising a semiconductor laser that can be driven with a low electric current or a low voltage and a method of operating such a gyro.

Another object of the present invention is to provide a gyro that is totally or almost free from problems such as coupling loss and optical feedback noise and a method of operating such a gyro.

Still another object of the present invention is to provide a compact gyro and a method of operating such a gyro.

According to a first aspect of the invention, the above object is achieved by providing a gyro comprising a ring resonator type semiconductor laser for having laser beams transmitted circularly in opposite directions relative to each other, wherein the angle α formed by the surface of the active layer of the semiconductor laser and the lateral surface of each of the low refractive index layers sandwiching the active layer and showing a refractive index lower than the active layer satisfies the requirement of $75° \leq \alpha \leq 105°$ over the entire periphery of the low refractive index layers.

The ring resonator type semiconductor laser can detect the beat signal produced by the rotation of the gyro as a change in the electric current flowing through the semiconductor laser, the voltage applied to the semiconductor laser or the impedance of the semiconductor laser.

Preferably, the surface precision of the lateral surface of each of the low refractive index layers is less than ½ of the wavelengths of the laser beams in the active layer.

According to a second aspect of the invention, there is provided a method of operating a gyro comprising a ring resonator type semiconductor laser, wherein the angle α formed by the surface of the active layer of the semiconductor laser and the lateral surface of each of the low refractive index layers sandwiching the active layer and showing a refractive index lower than the active layer satisfies the requirement of $75° \leq \alpha \leq 105°$ over the entire periphery of the low refractive index layers, the method using the change in the electric current, the voltage or the impedance as signal for determining the angular velocity of the ring resonator type semiconductor laser.

Preferably, the voltage or the electric current for driving the ring resonator type semiconductor laser is modulated by means of a frequency not found in the frequency band of the signal.

Preferably, a piezoelectric element is used to drive the ring resonator type semiconductor laser to rotate clockwise or counterclockwise.

DESCRIPTION OF THE PREFERRED EMBODIMENTS

Firstly, a method of detecting an angular velocity by means of a semiconductor laser according to the invention will be described by referring to FIG. 1.

Figure 1:
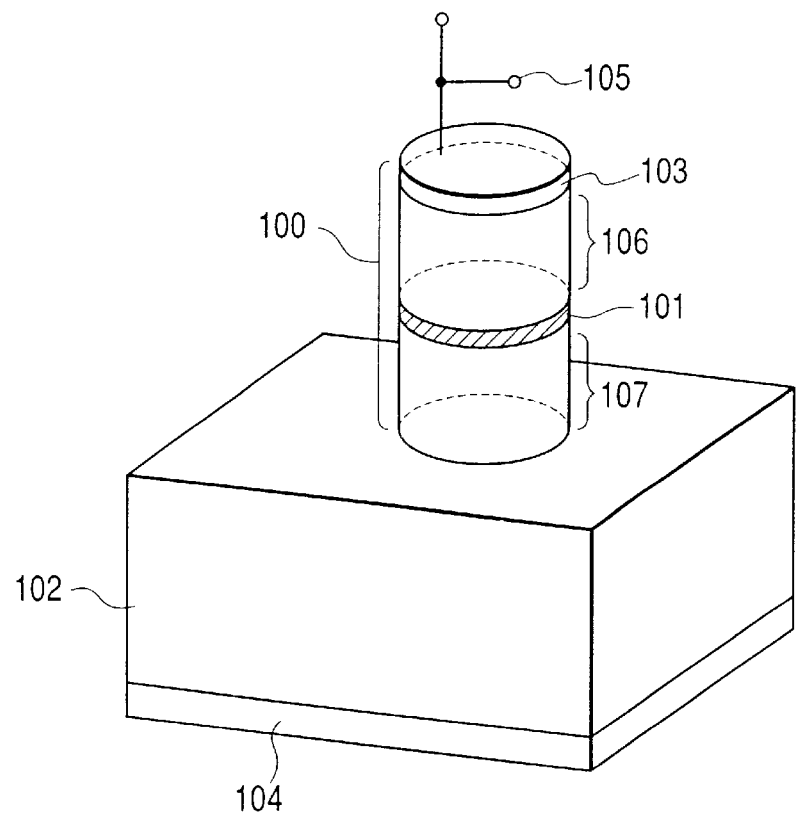
FIG. 1 is a schematic illustration of a method of detecting the angular velocity of a ring resonator type semiconductor laser according to the invention.
Figure 2:
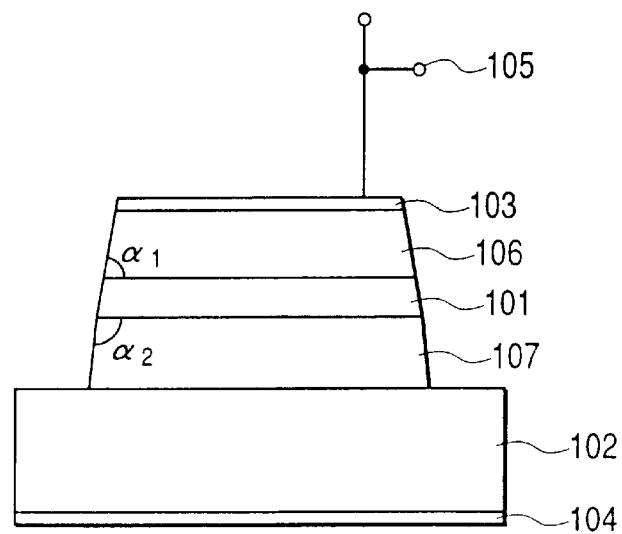
FIG. 2 is a schematic cross sectional view of a ring resonator type semiconductor laser according to the invention.

In FIG. 1, there are shown a semiconductor laser 100, an active layer 101, a substrate 102, an anode 103 and a cathode 104. Reference number 105 denotes an electric terminal. Note that the active layer 101 is sandwiched by cladding layers. As an electric current is injected from the anode 103, a laser beam guided along a ring is selectively amplified and a laser oscillation takes place when a threshold value is exceeded.

With the ring resonator type semiconductor laser arranged in the above described manner, laser beams that are generated in the ring resonator type laser are transmitted circularly. More specifically, there are a laser beam made to propagate clockwise and a laser beam made to propagate counterclockwise within the laser. So long as the ring resonator type laser is held to a halted state, the laser beam propagating clockwise and the laser beam propagating counterclockwise show the same oscillation frequency. However, when the laser is driven to turn, the laser beam propagating clockwise and the laser beam propagating counterclockwise give rise to a difference of oscillation frequencies as a result of Sagnac effect. The difference of oscillation frequencies Δf is expressed by formula (1) below;

$$\Delta f = (4S/\lambda L)\Omega \qquad (1)$$

where S is the area of the closed domain surrounded by the optical path, λ is the oscillation wavelength of the laser beams, L is the length of the optical path and Ω is the angular velocity of rotation. In the lasers in which an electric current will flow such as gas lasers and semiconductor lasers, the population inversion and the impedance show a 1 to 1 correspondence. When the laser beams interfere with each other in the laser, the population inversion changes the interference to consequently change the impedance between the electrodes of the laser. The change appears as the change in the electric current flowing through the laser when a constant voltage source is used as driving power source and as a change in the terminal voltage when a constant current source is used. In either case, a signal representing the interference of the laser beams can be taken out. More specifically, a beat signal is detected to represent the change in the frequencies of the electric current or the voltage. Then, a battery can be used for the constant voltage source to make the driving system down-sized and lightweight.

The change in the impedance can be observed directly by means of an impedance meter. In this case, the influence of the driving power source can be minimized unlike the case of observing the terminal voltage or the electric current flowing to an element of the laser.

If it is necessary to prevent any surge noise from entering the semiconductor laser through the detection terminal for detecting the change in the terminal voltage of the semiconductor laser, a protection circuit is preferably arranged between the circuit for observing the change in the voltage and the detection terminal. Then, the semiconductor laser can be protected against degradation and destruction due to surge noise and/or some other causes.

As described above, by arranging a terminal for detecting the change, if any, in the electric current, the voltage or the impedance attributable to the beat generated by the interference of the laser beams transmitted circularly in opposite senses, the beat signal can be detected as a function of the angular velocity of the laser. Thus, the present invention provides a gyro that operates without a photodetector and an optical system for optical coupling that are indispensable to conventional optical gyros.

The present invention will be described by way of specific arrangements.

In FIG. 1, there are shown an active layer 101 and a pair of low refractive index layers 106 and 107 showing a refractive index lower than the active layer and sandwiching the active layer 101. For example, the active layer 101 may be made of InGaAsP having a 1.55 μm composition with a pair of guiding layers made of InGaAsP having a 1.3 μm composition and arranged respectively on and under the active layer. They are then sandwiched by a pair of InP clad layers. Since a semiconductor and air show different refractive indexes, light is reflected by the interface thereof. If the refractive index of the semiconductor is 3.5, a total internal reflection takes place when the angle between a normal to the interface and a laser beam striking the interface is equal to or greater than 16.6°. Since the mode of operation with total internal reflection has a low oscillation threshold value if compared with other modes of operation because it is free from any mirror loss. Therefore, oscillation takes place with a relatively low level of the injected electric current. Additionally oscillation in any other mode is suppressed since this oscillation mode can get a gain dominantly.

The laser beam generated in the active layer 101 mostly seep out into the low refractive index layers including the guiding layers and the cladding layers and showing a refractive index lower than the active layer so that only a small fraction of the laser beam is confined to the active layer.

For example, if an InGaAsP active layer having a 1.55 μm composition is sandwiched by InGaSaP guiding layers having a 1.3 μm composition and InP cladding layers, the portion of the laser beam confined to the active layer and the guiding layers is less than 10% of the overall laser beam.

Therefore, it is necessary to reduce the loss of light in the low refractive index layers 106 and 107 in order to prevent such loss of light and make it possible to drive the laser with a low electric current or a low voltage.

Specifically, for driving the semiconductor laser with a low electric power, the semiconductor laser is preferably so configured that the angles $\alpha_1$ and $\alpha_2$ between the corresponding lateral surfaces of the low refractive index layers sandwiching the active layer 101 and the surface of the active layer are defined by $$75° \leq \alpha_1, \alpha_2 \leq 105°,$$

preferably by $$80° \leq \alpha_1, \alpha_2 \leq 100°,$$

more preferably by $$85° \leq \alpha_1, \alpha_2 \leq 95°.$$

Then, the lateral surfaces of the low refractive index layers operate as total internal reflection planes and the mirror loss for the light seeping into the low refractive index layers 106 abd 107 (evanescent light) can be prevented so that the semiconductor laser can be driven with a low electric current (or a low voltage). The above requirements for the angles $\alpha_1$ and $\alpha_2$ should be rigorously met particularly when the thickness of the active layer 101 is close to the wavelength of the laser beam. In other words, the above requirements for the angles $\alpha_1$ and $\alpha_2$ should be rigorously met when InP and GaAs are used and the active layer has a thickness less than 2 μm.

It is also desirable that the semiconductor laser has a total internal reflection plane at a lateral side thereof. If such is the case, preferably more than 90% of the region of the total internal reflection plane located within the reach of the seeping evanescent light has angles as defined above relative to the corresponding surfaces of the active layer.

It is also preferable that the above requirements for $\alpha_1$ and $\alpha_2$ are met over the entire peripheral surface of the low refractive index layers.

In order to prevent the loss of light due to the surface coarseness, the surface precision (surface coarseness) of the lateral surfaces of the low refractive index layers sandwiching the active layer 101 is preferably less than ½ of the wavelength of the laser beams in the active layer that is defined as the wavelength in vacuum divided by the effective refractive index of the medium, more preferably less than ⅓ of the wavelength. More specifically, in the case of an InGaAsP type laser (wavelength: 1.55 μm, effective refractive index of medium: 3.6), the surface precision of the lateral surfaces of the low refractive index layers is preferably less than about 0.22 μm, more preferably less than 0.14 μm.

In the case of a AlGaAs type laser (wavelength: 0.85 μm, effective refractive index of medium: 3.6), it is preferably less than about 0.12 μm, preferably less than 0.08 μm.

The term "surface precision" refers to the flatness of the lateral surfaces of the layers or the intraplanar difference of height. If the semiconductor laser has a cylindrical profile, the surface precision may be regarded to be as displacement from a real circle. It may be needless to say that not only the lateral surfaces of the low refractive index layers but also the lateral surface of the active layer preferably meet the above requirements.

A gyro according to the invention is not provided with a reflector within the reach of the seeping evanescent light generated by the ring resonator type laser.

If there is such a reflector within the reach of the seeping evanescent light, the reflector can be optically coupled with the laser to give rise to a loss from the viewpoint of the laser and there arises a beam returning from the reflector to the laser to operate as noise source.

To the contrary, so long as no reflector is present within the reach of the seeping evanescent light generated by the ring resonator type laser, the laser will be optically isolated from any other reflectors to become free from the influence of the outside and the loss attributable to external factors. Additionally, there will be no noise due to the returning beam. Thus, the coupling loss and the noise due to the returning beam can be remarkably reduced with this arrangement.

With a method of operating an optical gyro according to the invention, the change in the electric current, the voltage or the impedance detected at the terminal is used as signal for determining the angular velocity of the ring resonator type laser to eliminate the use of a photodetector and an optical system for optical coupling that is indispensable for conventional gyros so that a method of operating a gyro according to the present invention can dissolve the problem of coupling loss and that of the noise caused by the returning beams that are attributable to such components.

With a method of operating a gyro according to the invention, preferably the voltage or the electric current for driving the ring resonator type lasers is modulated by a frequency not found in the frequency band of the signal generated by the change in the voltage, the electric current or the impedance due to a beat.

As the gyro having a configuration as described above is driven to rotate, the oscillation frequency of the laser beam propagating clockwise and that of the laser beam propagating counterclockwise come to show a difference Δf that is expressed by formula (1) above. However, so long as the frequency difference Δf is small, it will be reduced to nil, or Δ=0, because the oscillation frequencies are pulled each other due to the non-linearity of the laser medium. This is a phenomenon referred to as lock-in.

This lock-in phenomenon is desirably avoided by holding the gyro in a state where the frequency difference Δf between the two oscillation frequencies constantly fluctuates.

Conventionally, the lock-in phenomenon is avoided by means of a dithering technique, which has an effect of modulating the angular velocity Ω in formula (1) above.

In a semiconductor laser, for instance, it is known that the oscillation frequency is fluctuated as a function of the electric current. This is because the refractive index of the semiconductor changes as a function of the electric current.

Therefore, by electric current modulation of the semidonductor laser, λ in formula (1) can be modulated to make it possible to produce a state where Δf always fluctuates.

Then, the lock-in phenomenon can be avoided without adversely affecting the signal by modulating the laser oscillation frequency in a frequency band different from that of the beat signal.

Of course, a similar effect can be obtained by modulating the voltage by way of a resistor connected in series because the electric current flowing to the semiconductor laser is also modulated.

In the case of a gas laser, the value of Q of the active medium can be fluctuated by modulating the electric current or the voltage in order to fluctuate the oscillation frequency. This is because the oscillation frequency of the gas laser is determined by the Q value of the resonance transition of atoms, molecules or ions and the Q value of the resonator and this effect is referred to as that of "the oscillation frequency pulling".

Additionally, with the above method of operating a gyro comprising a ring resonator type laser, the direction of oscillation and the level of the terminal voltage can be made to correspond to each other by applying a vibration to the gyro in a frequency different from that of the beat signal and detecting the signal from the terminal synchronously with the vibration. For instance, when a vibration is applied clockwise to the gyro, the frequency of the terminal voltage will be raised if the optical gyro is driven to turn clockwise whereas the frequency of the terminal voltage will be lowered if the gyro is driven to turn counterclockwise. Thus, it is possible to detect if the gyro is turning clockwise or counterclockwise by utilizing this technique without adversely affecting the signal by modulating the laser oscillation frequency in a frequency band different from that of the beat signal.

Now, a gyro and a method of operating the same according to the invention will be described in greater detail along with their advantages by referring to the accompanying drawings.

Embodiment 1

Figure 3:
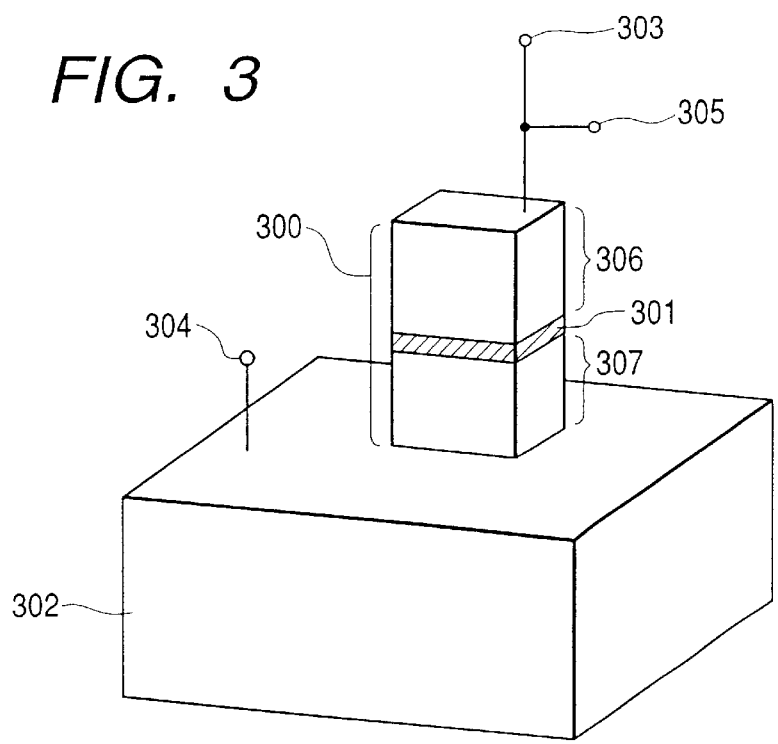
FIG. 3 is a schematic perspective view of a first embodiment of a ring resonator type semiconductor laser according to the invention.

FIG. 3 is a schematic perspective view of an embodiment of gyro comprising a ring resonator type laser for having laser beams transmitted circularly. In this embodiment, the semiconductor laser 300 has a rectangular pillar-like profile. Referring to FIG. 3, there are shown an electric terminal 305, an anode 303, a cathode 304 and a substrate 302 carrying the semiconductor laser thereon. Reference numerals 306 and 307 denote respective low refractive index layers showing a refractive index lower than the active layer 301.

The semiconductor laser is so configured that the angles between the corresponding lateral surfaces of the low refractive index layers 306 and 307 sandwiching the active layer 301 and the surface of the active layer 301 are not smaller than 75° and not greater than 105°.

More specifically, unlike the prior art of forming the component layers of the semiconductor laser by deposition and subsequently removing only the portions that make so many total internal reflection corner mirrors by etching, the entire lateral surface is removed (typically by etching) for the semiconductor laser of the present invention.

Figure 4:
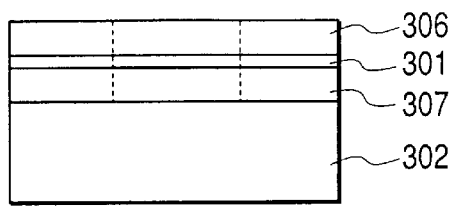
FIG. 4 is a schematic illustration of the first embodiment of a ring resonator type semiconductor laser according to the invention.
Figure 5:
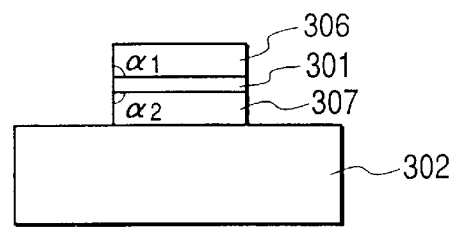
FIG. 5 is another schematic illustration of the first embodiment of a ring resonator type laser according to the invention.
Figure 6:
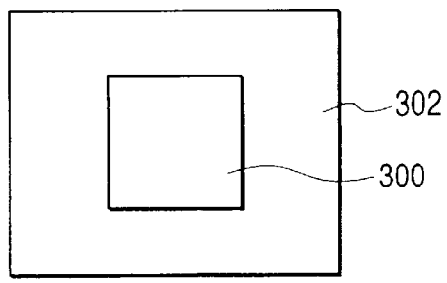
FIG. 6 is still another schematic illustration of the first embodiment of a ring resonator type laser according to the invention.
Figure 7:
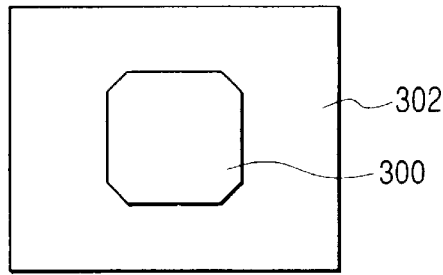
FIG. 7 is still another schematic illustration of the first embodiment of a ring resonator type laser according to the invention.

Referring to FIG. 4, after forming the component layers, all the lateral sides are etched to produce a rectangular pillar as shown in FIG. 5. FIG. 6 is a schematic plan view corresponding to FIG. 5. Techniques that can be used for the etching operation include wet etching, gas etching, plasma etching, sputter etching, reactive ion etching (RIE) and reactive ion beam etching (RIBE). The corners may be cut as shown in FIG. 7. With the operation of etching all the lateral sides of the low refractive index layers sandwiching the active layer according to the invention, the overall manufacturing process can be significantly simplified.

Additionally, any loss of light can be prevented from taking place by satisfying the above angular requirements to make it possible to drive the semiconductor laser with a low electric power. With the above arrangement, a substantially total internal reflection plane is formed on each of the lateral sides of the low refractive index layers. Then, a gyro adapted to detect the rotation of an object can be realized by arranging such a semiconductor laser 300 that is driven by a constant current and detecting the change in the voltage being applied to the laser at the electric terminal 305. Of course, it is possible to drive the semiconductor laser with a constant voltage and detect the change in the electric current flowing through the semiconductor laser. It is also possible to detect the rotation of an object by detecting the change in the impedance of the semiconductor laser.

Figure 8:
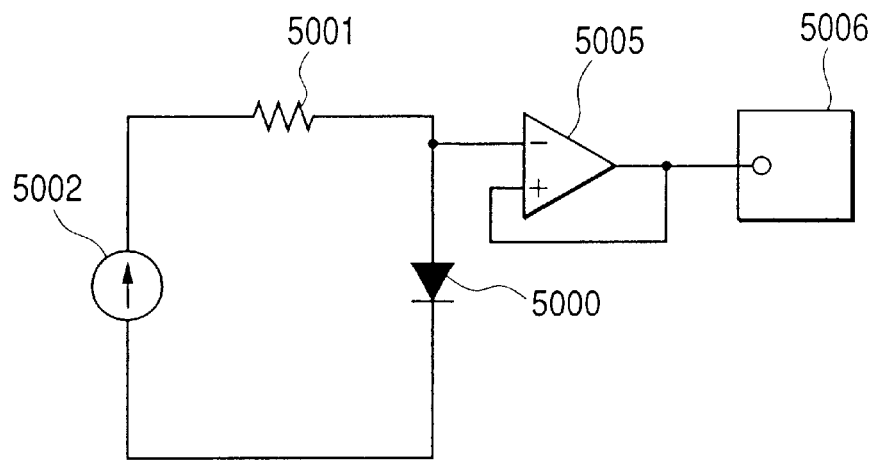
FIG. 8 is a schematic circuit diagram of a circuit for detecting a beat signal that can be used for the purpose of the invention.

The semiconductor laser can be protected against degradation and destruction by arranging a protection circuit at the detection terminal of the semiconductor laser. FIG. 8 shows a voltage follower 5005 connected as protection circuit. In the circuit diagram of FIG. 8, reference numeral 5000 denotes a semiconductor laser and reference numeral 5001 denote a resistor, whereas reference numeral 5002 denotes a current source and reference numeral 5006 denotes a voltage detector.

Figure 9:
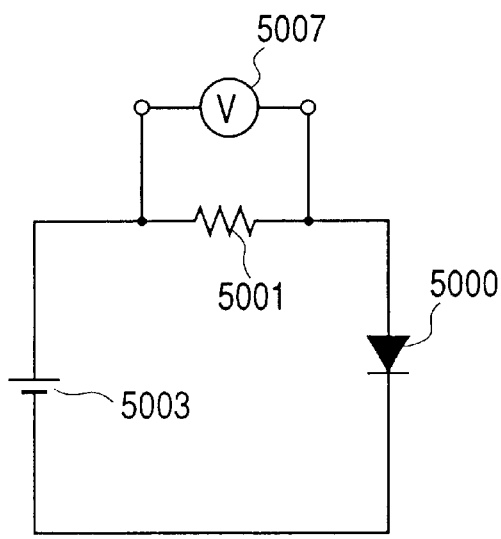
FIG. 9 is a schematic circuit diagram of another circuit for detecting a beat signal that can be used for the purpose of the invention.
Figure 10:
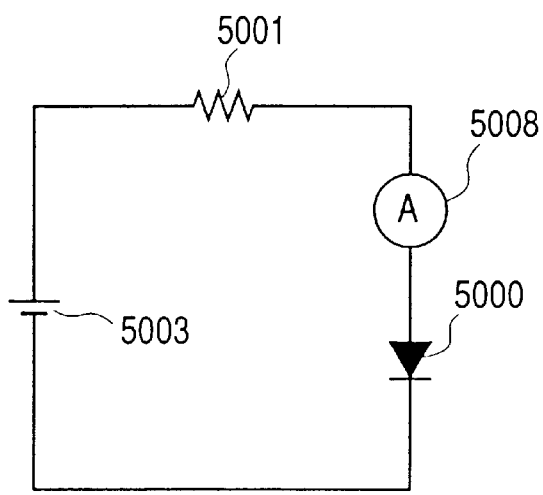
FIG. 10 is a schematic circuit diagram of still another circuit for detecting a beat signal that can be used for the purpose of the invention.

When a constant voltage source is used as power source, the angular velocity of rotation of the semiconductor laser can be detected by observing the change in the electric current flowing to the semiconductor laser. The drive system of the semiconductor laser can be made down-sized and lightweight when a battery 5003 is used as constant voltage source as shown in FIGS. 9 and 10. In FIG. 9, a resistor 5001 is connected in series to the semiconductor laser 5000 and the electric current flowing to the semiconductor laser is detected by observing the change in the voltage at the opposite ends of the resistor. In FIG. 9, reference numeral 5007 denotes a voltmeter. In FIG. 10, an ammeter 5008 is connected in series to a semiconductor laser 5000 to directly observe the electric current flowing to the semiconductor laser.

Figure 11:
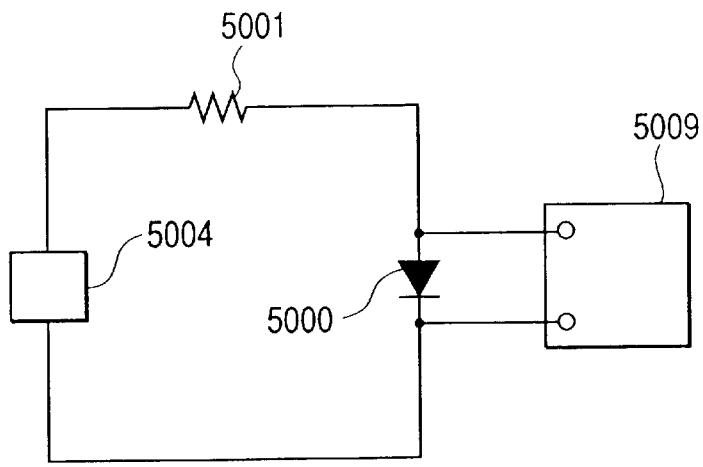
FIG. 11 is a schematic circuit diagram of still another circuit for detecting a beat signal that can be used for the purpose of the invention.

It is also possible to observe the change in the impedance of a semiconductor laser 5000 directly by means of an impedance meter 5009 regardless of the type of current source as whon in FIG. 11. With this arrangement, the influence of the driving power source can be minimized unlike the arrangement of observing the terminal voltage or the electric current flowing to the laser.

Another circuit for detecting a beat signal to be used for the purpose of the present invention will be described below.

Figure 12:
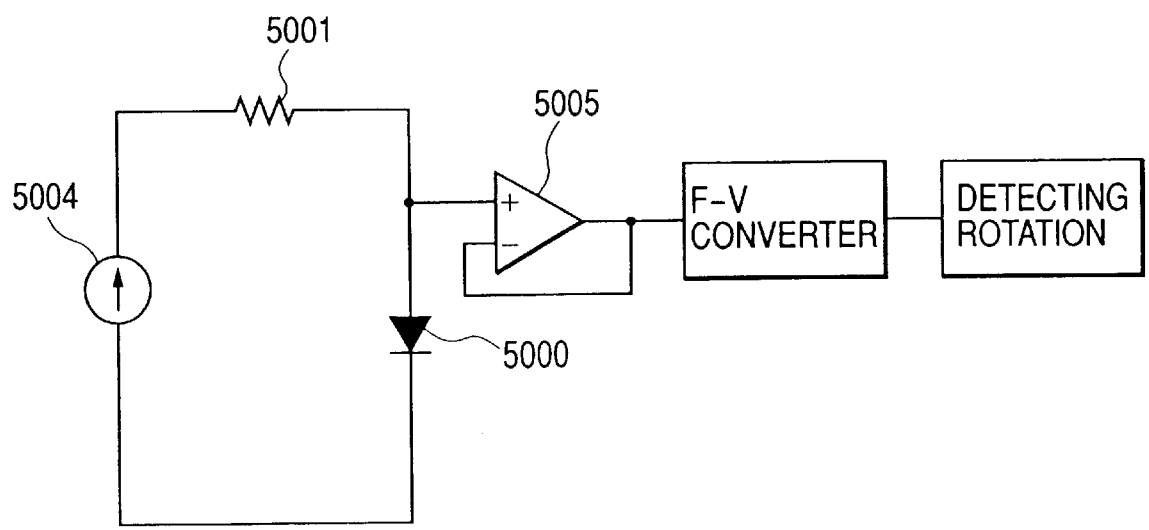
FIG. 12 is a schematic circuit diagram of still another circuit for detecting a beat signal that can be used for the purpose of the invention.

Referring to FIG. 12, the anode of a ring resonator type gas laser 5000 is connected to an operational amplifier 5005 operating as buffer. Since the operational amplifier 5005 outputs a signal having a beat frequency that is proportional to the angular velocity, it is transformed into a voltage by means of a known frequency/voltage converter (F-V converter) to detect the revolutions per unit time. In FIG. 12, reference numeral 5004 denotes a constant current source.

It may be needless to say that the operational amplifier 5005 (voltage follower) may be omitted if desired characteristics are shown without it.

Figure 13:
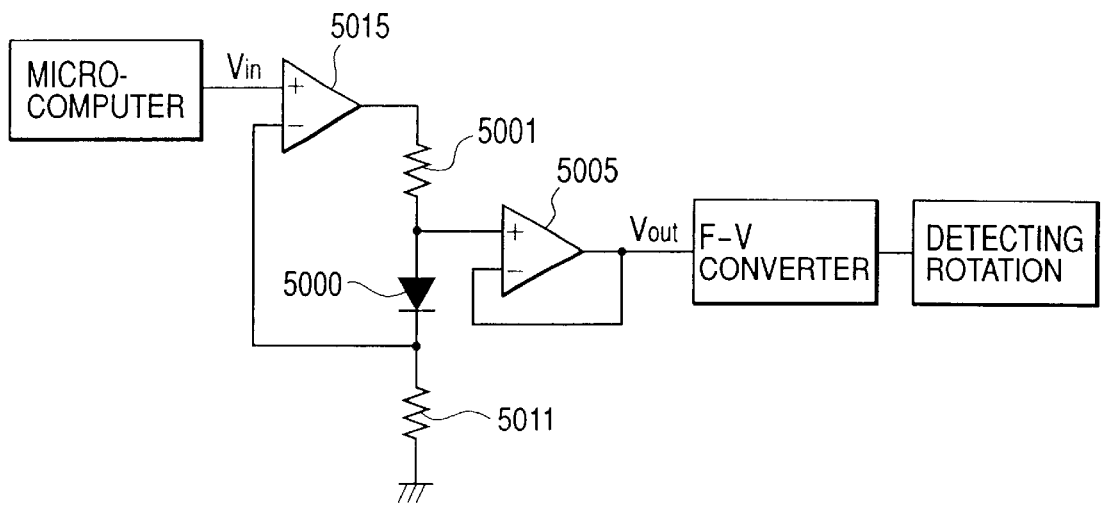
FIG. 13 is a schematic circuit diagram of still another circuit for detecting a beat signal that can be used for the purpose of the invention.

FIG. 13 is a circuit diagram of a circuit designed to drive a laser 5000 with a constant current, read the change in the anode potential of the laser 5000 and detect the revolution.

The anode of the laser 5000 is connected to the output terminal of an operational amplifier 5015 by way of a protective resistor 5001 and the cathode of the laser 5000 is connected to the inverting input terminal of the operational amplifier 5015.

Resistor 5011 is connected between the inverting input terminal of the operational amplifier 5015 and a reference potential.

When a constant voltage Vin is applied to the non-inverting input terminal of the operational amplifier 5015 from, for example, a microcomputer, the electric current defined by the potential and the resistance of the resistor 5011 flows to drive the laser 5000 with the constant current. The anode of the laser 5000 is connected to the operational amplifier 5005. The operational amplifier 5005 outputs signal Vout having a beat frequency proportional to the angular velocity, whose frequency is then transformed into a voltage by means of a known frequency/voltage converter (F-V converter) so that the revolution may be detected.

Figure 14:
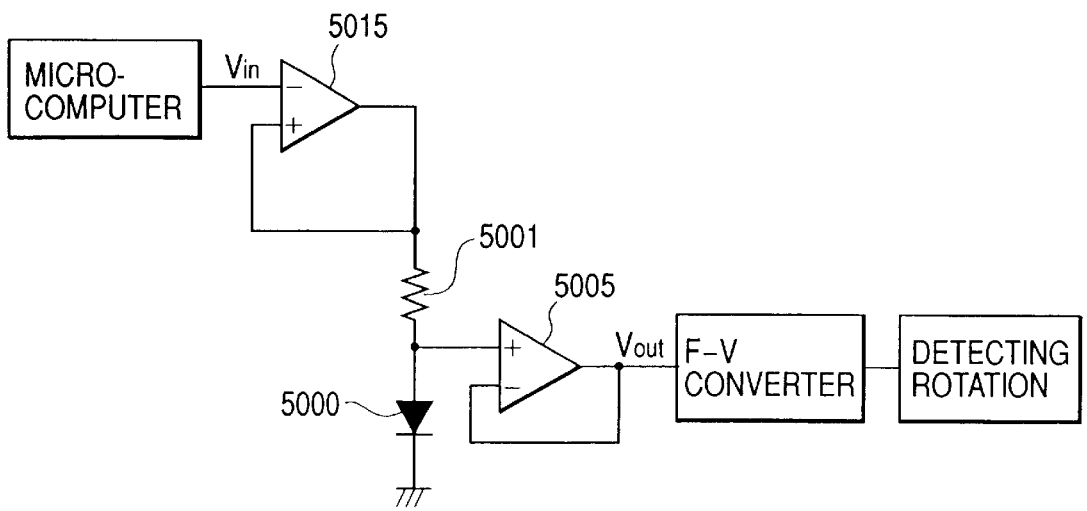
FIG. 14 is a schematic circuit diagram of still another circuit for detecting a beat signal that can be used for the purpose of the invention.

FIG. 14 is a circuit diagram of a circuit for detecting a beat signal accompanying a rotation. The rotation of a laser is detected by driving a ring resonator type laser 5000 with a constant voltage and reading the electric current flowing to the laser as the voltage drop across the resistor 5001.

The anode of the laser 5000 is connected to the output terminal of an operational amplifier 5015 by way of the resistor 5001 and the cathode of the laser 5000 is grounded to provide a reference potential.

When a constant voltage Vin is applied to the inverting input terminal of the operational amplifier 5015 from a microcomputer, the voltage is constantly applied to the resistor 5001 and the laser 5000 to realize a constant voltage drive arrangement.

The resistor 5001 is connected to the operational amplifier 5005 operating as buffer. The operational amplifier 5005 outputs signal Vout. Since this signal has a beat frequency that is proportional to the angular velocity, it is transformed into a voltage by means of a known frequency/voltage converter (F-V converter) to detect the revolutions per unit time. It may be needless to say that the revolutions per unit time can also be detected by feeding the F-V converter with a signal obtained from a portion of the circuit showing a voltage equal to that of the resistor.

Figure 15:
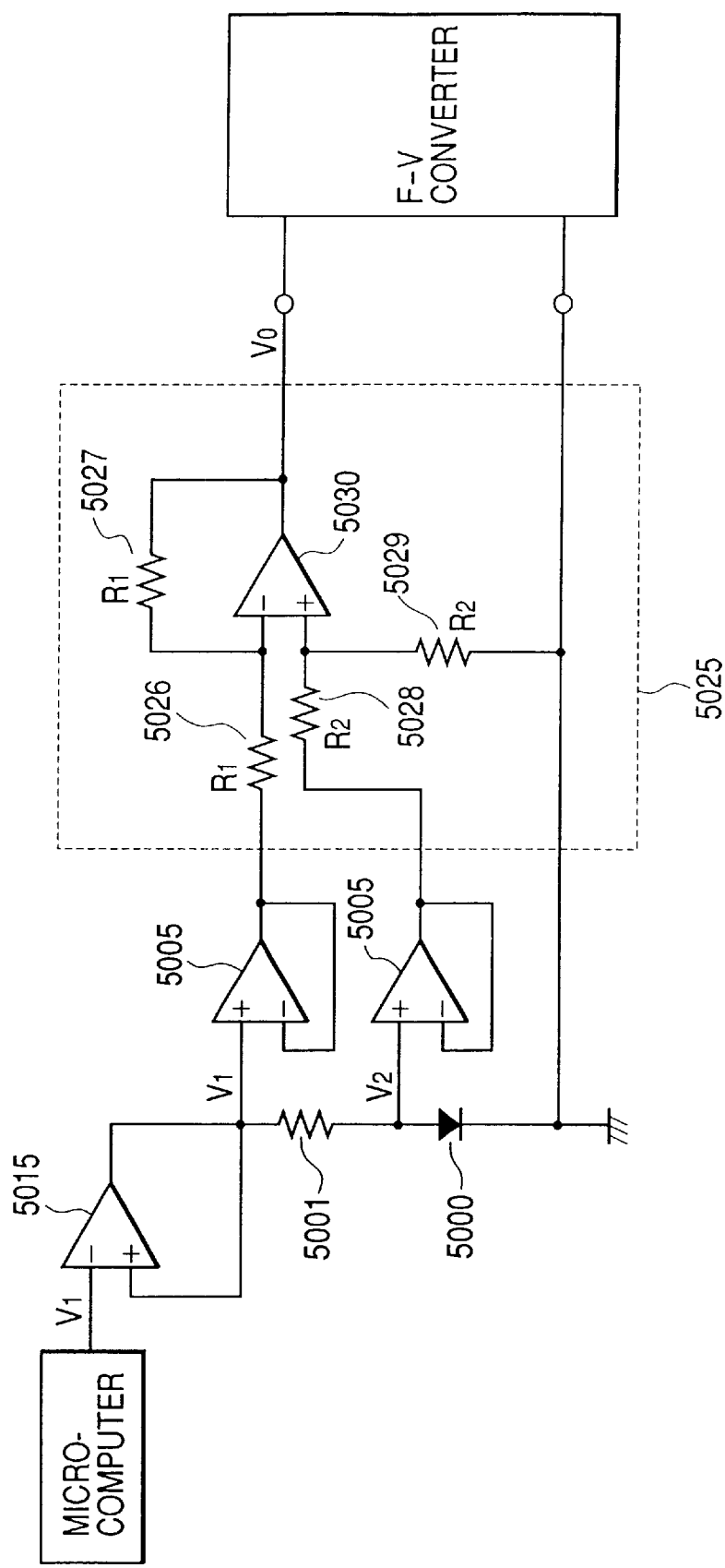
FIG. 15 is a schematic circuit diagram of still another circuit for detecting a beat signal that can be used for the purpose of the invention.

FIG. 15 is a circuit diagram of a circuit realizing by adding a subtractor 5025 to a constant voltage drive arrangement similar to that of FIG. 14 in order to use the ground voltage as reference for the signal voltage.

With this arrangement, a constant voltage $V_1$ is applied to the inverting input terminal of the operational amplifier 5015 from a microcomputer. In FIG. 15, reference numerals 5000 and 5005 denotes a ring resonator type laser and voltage followers and reference numerals 5001 and 5026 through 5029 denote respective resistors. The resistors 5026 and 5027 and the resistors 5028 and 5029 have equal resistance values, respectively.

The voltages $V_1$ and $V_2$ of the opposite ends of the resistor 5001 are applied respectively to the inverting input terminal and the non-inverting input terminal of the amplifier 5030 by way of the respective voltage followers and the respective resistors 5026 and 5028. With this arrangement, the change in the voltage $V_2-V_1$ (=$V_0$) applied to the resistor 5001 can be detected by using the ground voltage as reference voltage. Therefore, the change in the electric current flowing to the ring resonator type laser 5000 can be detected.

The obtained signal is then fed to an F-V converter to detect the revolutions per unit time of the laser. It is possible to use a frequency counter circuit.

Figure 16:
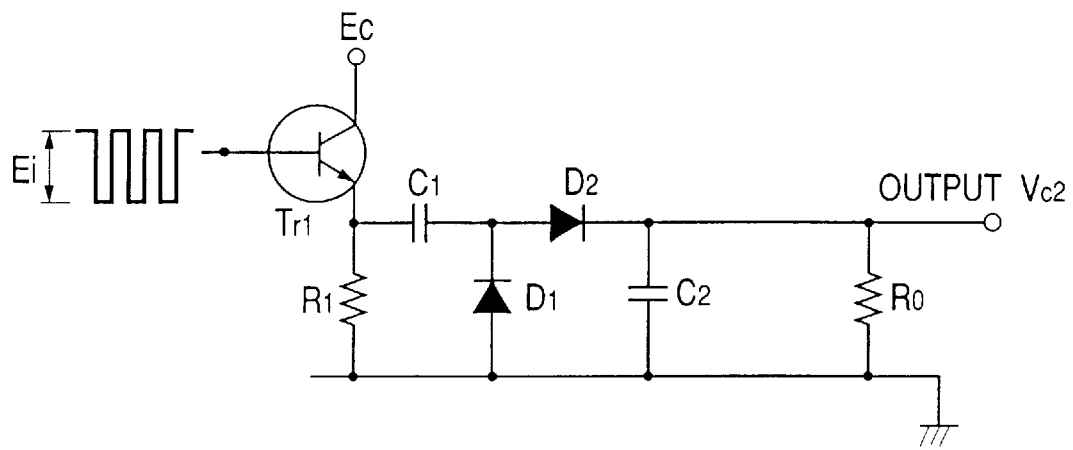
FIG. 16 is a schematic circuit diagram of an F-V converter that can be used for the purpose of the invention.

FIG. 16 is a schematic circuit diagram of a frequency/voltage converter (F-V converter), although any other appropriate circuit configuration may be used for an F-V converter for the purpose of the invention. The converter comprises a transistor, diodes, capacitors and resistors and its output voltage $V_{c2}$ is expressed by formula (2) below;

$$V_{c2}=E_i C_1 R_0 f[1+1/\{1-\exp(-1/R_0 C_2 f)\}] \qquad (2)$$

where $E_i$ is the peak-to-peak value of the input voltage and f is the beat frequency. By selecting circuit parameters that make $C_2 \gg C_1$ and $R_0 C_2 f \ll 1$, the formula (2) is reduced to formula (3) below;

$$V_{c2} \approx E_i C_1 R_0 f/2 \qquad (3),$$

so that it is now possible to obtain a voltage output that is proportional to the beat frequency.

When total reflection takes place, there exists evanescent light that proceeds along the interface. If the oscillator wavelength is 1.55 µm, the reach of the seeping evanescent light is 0.074 µm. Since the intensity of seeping evanescent light attenuates as an exponential function (the reach of seeping evanescent light is defined as the distance at the end of which the field amplitude attenuates to 1/e), any returning beam can be disregarded if the device is separated from a reflector by 10 µm with a wide margin. The above arrangement is described on an assumption that no reflector exists within 10 µm from the boundary of the rectangular pillar of the semiconductor laser 300 in FIG. 3 so that the device is free from the effect of returning light that can operates as noise.

It is preferable that the voltage or the injected electric current is modulated in a frequency not found in the frequency band of the beat signal in order to avoid any adverse effect on the signal.

For example, an optical gyro that is free from the lock-in phenomenon when it is rotated in a frequency corresponding to a beat frequency lower than 1 Hz can be realized by modulating the injected electric current to an amplitude of 0.1 mA and a frequency of 2 kHz.

Materials that can be used for the active layer of a semiconductor laser according to the invention include GaAs, InP, ZnSe, AlGaAs, InGaAsP, InGaAlP, InGaAsP, GaAsP, InGaAsSb, AlGaAsSb, InAsSbP, PbSnTe, GaN, GaAlN, InGaN, InAlGaN, GaInP, GaInAs and SiGe.

The above listed materials can also be used for the cladding layers. Combinations of materials that can be used for the active layer and the cladding layers include PbSnTe (active layer)/PbSeTe (cladding layer), PbSnSeTe (active layer)/PbSeTe (cladding layer), PbEuSeTe (active layer)/PbEuSeTe (cladding layer), PbEuSeTe (active layer)/PbTe (cladding layer), InGaAsSb (active layer)/GaSb (cladding layer), AlInAsSb (active layer)/GaSb (cladding layer), InGaAsP (active layer)/InP (cladding layer), AlGaAs (active layer) AlGaAs (cladding layer) and AlGaIP (active layer)/AlGaIP (cladding layer).

In terms of the structure of a semiconductor laser according to the invention, the active layer is not limited to the bulk structure and may alternatively use a single quantum well (SQW) structure or a multiple quantum well (MQW) structure. When a quantum well type laser is used, it can preferably use a strained quantum well type structure. If such is the case, the active layer is formed by eight InGaAsP quantum well layers having an about 1% compression strain and an InGaAsP barrier layer. Alternatively, an MIS structure may be used for the purpose of the invention.

As for the substrate, a substrate of any type on which desired materials can be grown may be used for the purpose of the invention. Substrates that can be used for the purpose of the invention include compound semiconductor substrates such as a GaAs substrate, an InP substrate, a GaSb substrate, an InAs substrate, a PbTe substrate, a GaN substrate, a ZnSe substrate and a ZnS substrate, in addition to an SiC substrate, a 4H-SiC substrate, a 6H-SiC substrate, a sapphire substrate, a silicon substrate and an SOI substrate.

Techniques that can be used for forming the active layer of a semiconductor layer unit according to the invention include the liquid phase epitaxy method (LPE method), the molecular beam epitaxy method (MBE method), the metal organic vapor phase growth method (MOCVD method, MOVPE method), the atomic layer epitaxy method (ALE method), the metal organic molecular beam epitaxy method (MOMBE method) and the chemical beam epitaxy method (CBE method).

Materials that can be used for the anode of a semiconductor laser according to the invention include non-limitatively Cr/Au, Ti/Pt/Au and AuZn/Ti/Pt/Au. Materials that can be used for the cathode of a semiconductor laser according to the invention include AuGe/Ni/Au and AuSn/Mo/Au but not limited thereto. The electrodes may be arranged inversely relative to the illustrated arrangement depending on the conduction type of the substrate and that of the active layer. This is true for the other embodiments. According to a preferable arrangement of the electrodes, a cap layer (contact layer) is formed on the cladding layers in order to reduce the contact resistance relative to the electrodes and subsequently the electrode material is formed on the cap layer. For example, an arrangement of InGaAsP (active layer)/P-type InP (cladding layer)/P-type InGaAsP (cap layer)/electrode may be used.

While it may appear that the cathode is arranged under the substrate in the drawings, the anode and the cathode may be arranged inversely depending on the type of the substrate.

In order to prevent any adverse effect of heat on a semiconductor laser according to the invention, a semiconductor laser chip may preferably be mounted on a heat emitting (heat sink) material. Heat sink materials that can be used for the purpose of the invention include non-limitatively Cu, Si, SiC, AlN and diamond. If necessary, a Peltier device may additionally be used to control the temperature.

For the purpose of reliably providing a semiconductor laser according to the invention with a total internal reflection plane and/or protecting it against degradation, an insulating film (coating film) may be formed on the lateral surface (in a region where light exists) of the semiconductor laser. Materials that can be used for the coating film include $SiO_2$, SiN, $Al_2O_3$, $Si_3N_4$ and other insulating materials and amorphous silicon (a-Si).

Embodiment 2

Figure 17:
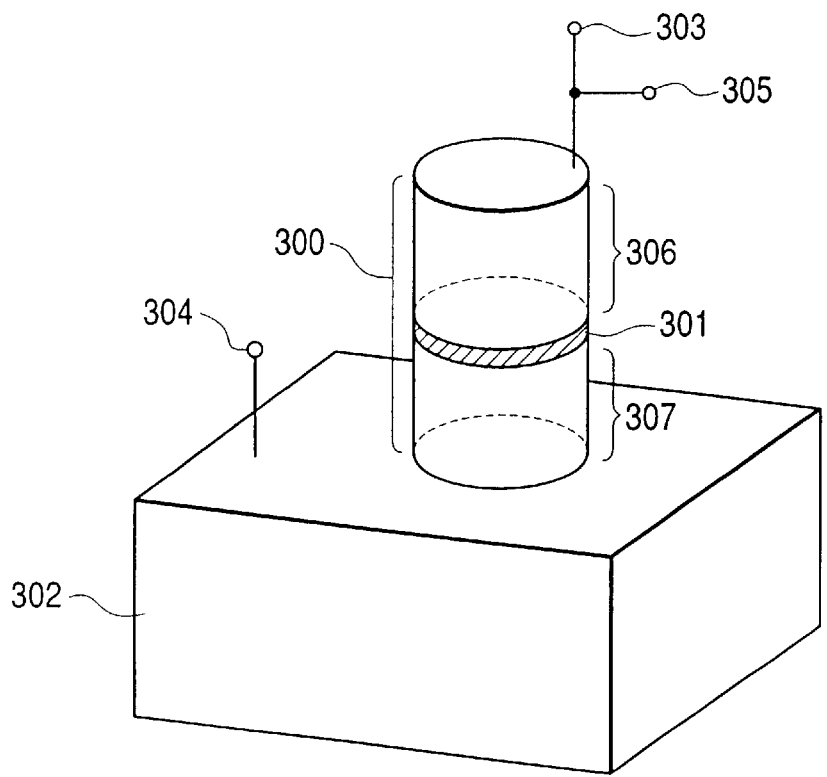
FIG. 17 is a schematic illustration of a second embodiment of a ring resonator type laser according to the invention.

FIG. 17 is a schematic perspective view of a second embodiment of gyro according to the invention and comprising a ring resonator type laser adapted to have laser beams transmitted circularly. This embodiment differs from the first embodiment (FIG. 3) mainly in that the semiconductor laser 300 of this embodiment has a cylindrical pillar-like profile. Otherwise, it is the same as the first embodiment. In FIG. 17, there are shown an active layer 301, a pair of low refractive index layers 306 and 307 sandwiching the active layer 301. Again, this embodiment can be driven with a low drive electric current when the angles $\alpha_1$ and $\alpha_2$ between the corresponding lateral surfaces of the low refractive index layers 306 and 307 sandwiching the active layer 301 and the surface of the active layer 301 satisfy the requirement of $75° \leq \alpha_1, \alpha_2 \leq 105°$.

Figure 18:
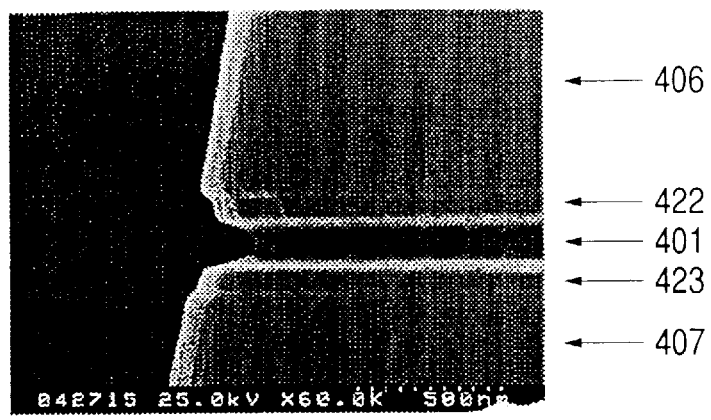
FIG. 18 is an SEM image of the second embodiment of a ring resonator type laser according to the invention.

FIG. 18 is an FE-SEM image of the second embodiment of ring resonator type laser according to the invention when a beat signal is obtained with a driving current of 0.5 mA.

In FIG. 18, reference numeral 401 denotes an active layer (InGaAsP with a 1.55 $\mu$m composition) and reference numerals 422 and 423 denote respective guiding layers (InGaAsP with a 1.3 $\mu$m composition), whereas reference numerals 406 and 407 denote respective cladding layers (InP).

The angles formed by the active layer and the clad layers 406 and 407 are found to be $\alpha_1=80°$ and $\alpha_2=103°$.

The lateral side of the semiconductor laser is prepared by means of RIBE.

More specifically, InP and InGaAsP are made to grow on an InP substrate.

In the process of forming the layers, the substrate temperature is held at 200° C. and chlorine gas is used as etching gas. The pressure of the chlorine gas is $2\times10^{-4}$ Torr and the microwave power is 120 W, while the voltage for extracting chlorine ions is 500V.

An etching rate of 1.2 $\mu$m/min is obtained under the above conditions.

Figure 19:
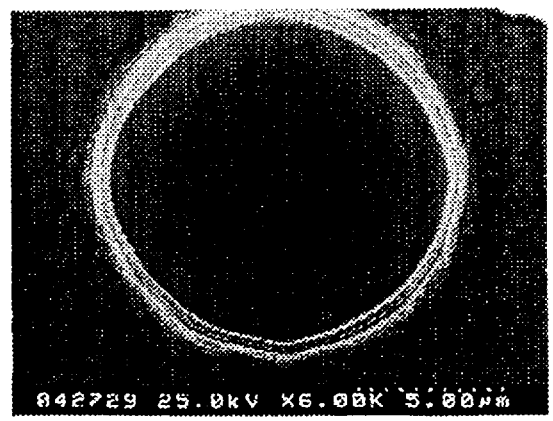
FIG. 19 is another SEM image of the second embodiment of a ring resonator type laser according to the invention.
Figure 20:
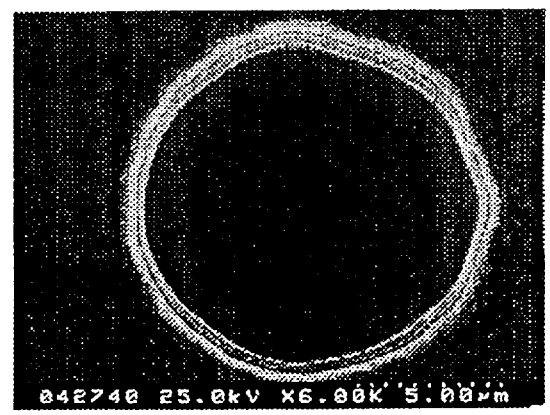
FIG. 20 is an SEM image illustrating the present invention.

In an experiment, the relationship between the surface precision of the low refractive index layers and the driving current was observed. A beat signal was obtained with a driving current of 4 mA when the low refractive index layers were close to a real circle as shown in FIG. 19 (where the maximum error from a real circle was 0.14 $\mu$m), whereas no beat signal was obtained with that drive current when the maximum error from a real circle was 0.4 $\mu$m (which was greater than ⅓ of the in-medium wavelength) as shown in FIG. 20. The both specimens of laser had a diameter of 13.4 $\mu$m. The expression "in-medium wavelength" refers to the value obtained by dividing the oscillation wavelength of the semiconductor laser in vacuum with the effective refractive index of the medium (which is about 0.43 $\mu$m in the case of an active layer of InGaAsP when an oscillation wavelength is 1.55 $\mu$m and an effective refractive index of the medium is 3.6).

The in-medium wavelength is about 0.24 $\mu$m in the case of an active layer of GaAs or AlGaAs with an oscillation wavelength of 0.85 $\mu$m and an equivalent refractive index of 3.6.

Embodiment 3

Figure 21:
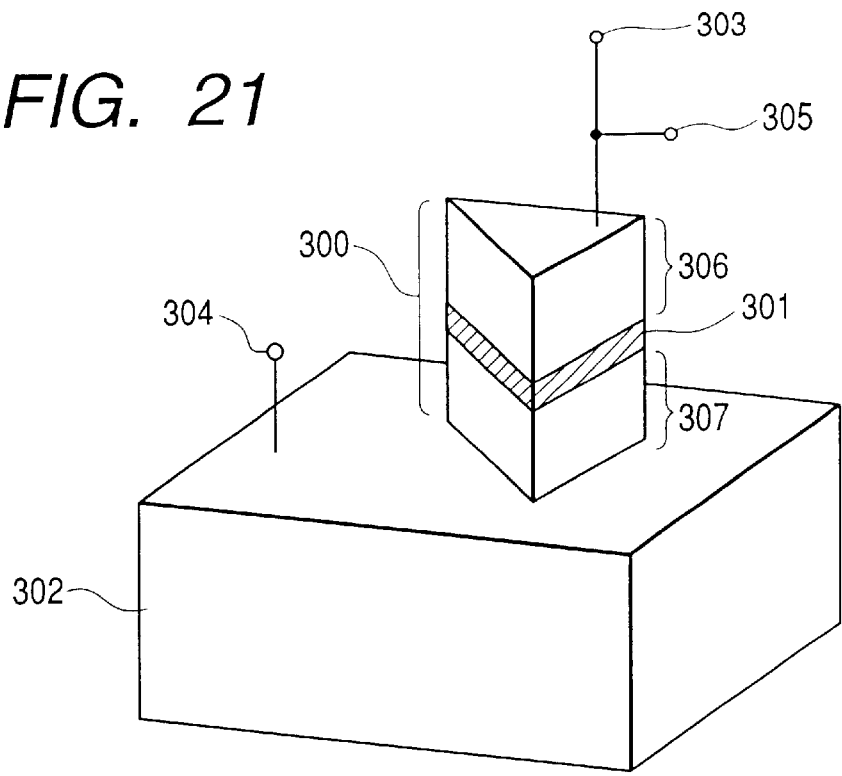
FIG. 21 is a schematic perspective view of a gyro comprising a ring resonator type semiconductor laser according to the invention.

FIG. 21 is a schematic perspective view of a third embodiment of gyro according to the invention and comprising a ring resonator type laser adapted to have laser beams transmitted circularly. This embodiment differs from the first embodiment mainly in that the semiconductor laser of this embodiment has a triangular pillar-like profile. Otherwise, it is the same as the first embodiment.

In FIG. 21, there are shown a semiconductor laser 300, an active layer 301, a substrate 302, an anode 303, a cathode 304 and an electric terminal 305. The active layer 301 is sandwiched by a pair of low refractive index layers 306 and 307.

Again, this embodiment can be driven with a low driving electric current or low driving voltage when the angles $\alpha_1$ and $\alpha_2$ between the corresponding lateral surfaces of the low refractive index layers sandwiching the active layer and the surface of the active layer satisfy the requirement of $75° \leq \alpha_1, \alpha_2 \leq 105°$.

While the ring resonator type lasers of the above first through third embodiments are described in terms of hollow cylindrical, rectangular and triangular pillar-like profiles, the profile of a ring resonator type laser according to the invention is by no means limited thereto so long as it is configured so as to operate as ring resonator type laser. For example, it may show a disk-like profile in stead of a pillar-like profile.

Figure 22:
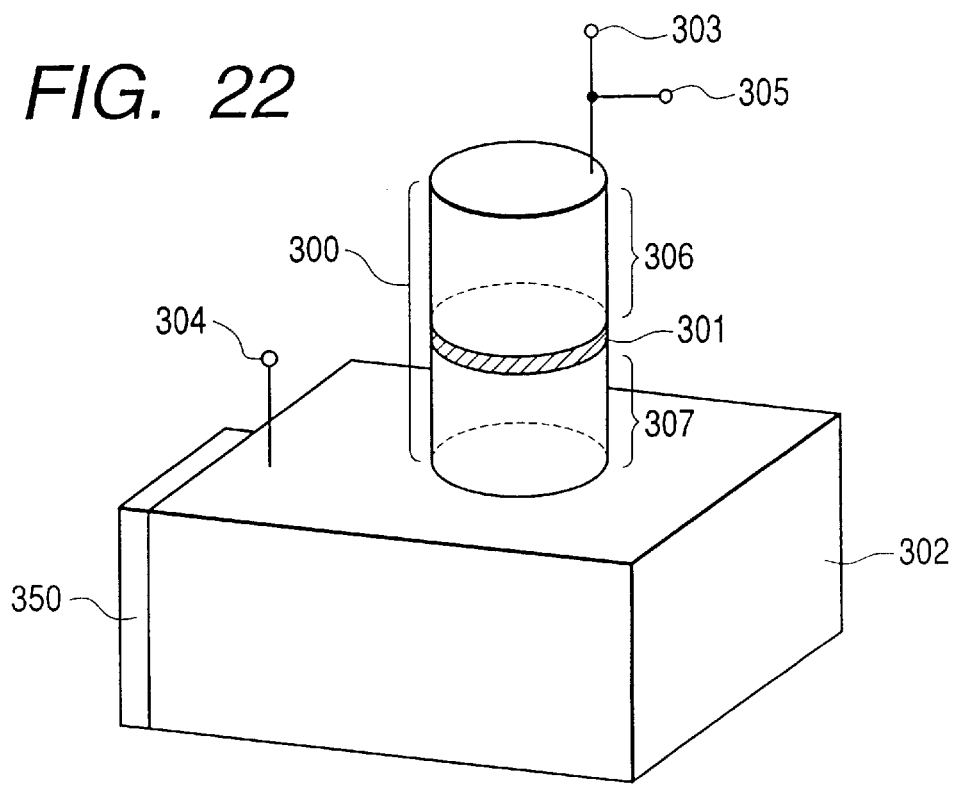
FIG. 22 is a schematic perspective view of another gyro comprising a ring resonator type semiconductor laser according to the invention.

FIG. 22 is a schematic perspective view of a gyro comprising a ring resonator type laser for having laser beams transmitted circularly. In this gyro, the substrate 302 of the semiconductor laser of the gyro is provided with a piezoelectric element 350. With the above arrangement, it is possible to drive the semiconductor laser 300 of the gyro clockwise or counterclockwise by applying a voltage having a frequency of 20 kHz to the piezoelectric element 350. Then, a clockwise rotation of the semiconductor laser can be identified and differentiated from a counterclockwise rotation by detecting the signal synchronized with the voltage applied to the piezoelectric element 350 from terminal 305. For example, the frequency of the terminal voltage will be raised if the semiconductor laser 300 is driven to turn clockwise when applying an oscillation for a clockwise rotation. Contrary, the frequency of the terminal voltage will be lowered if the semiconductor laser 300 is driven to turn counterclockwise when applying an oscillator for a clockwise rotation. Additionally, the sense of rotation of the semiconductor laser can be detected easily without adversely affecting the signal by modulating the signal in a frequency band that is totally different from the signal frequency. The piezoelectric element may be made of a piezoelectric ceramic material such as PZT or lead niobate or a piezoelectric polymeric material.

(EXAMPLE 1)

Figure 23:
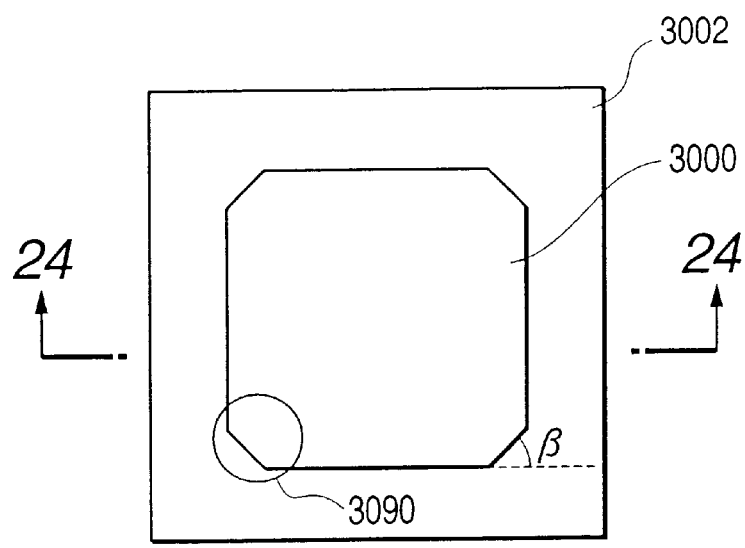
FIG. 23 is a schematic plan view of a gyro comprising a ring resonator type semiconductor laser according to the invention.
Figure 24:
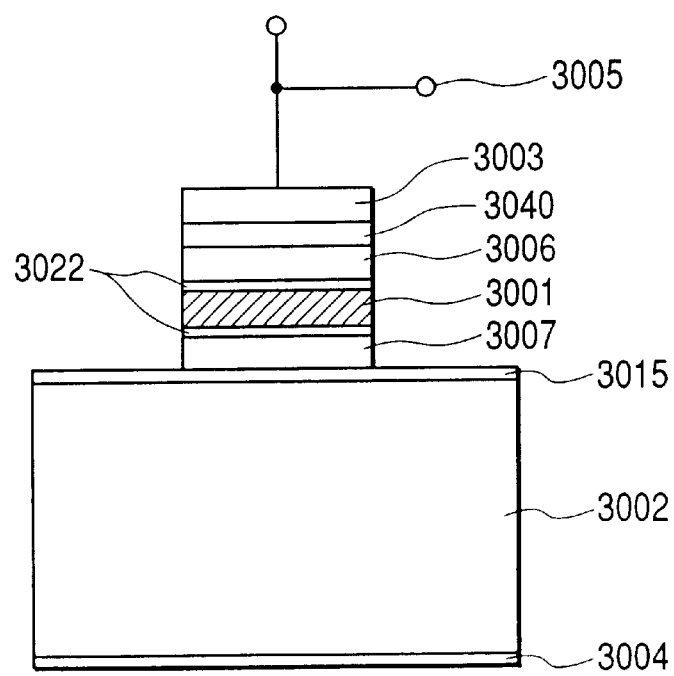
FIG. 24 is a schematic cross sectional view of a ring resonator type semiconductor laser according to the invention.

FIG. 23 is a schematic plan view of a gyro comprising a ring resonator type laser 3000 for having laser beams transmitted circularly. It has a rectangular waveguide path. FIG. 24 is a schematic cross sectional view taken along line 24—24 in FIG. 23. Referring to FIG. 24, there are shown an active layer 3001, guiding layers 3022, a substrate 3002, an anode 3003, a cathode 3004, an electric terminal 3005, cladding layers (low refractive index layers) 3006 and 3007 and a cap layer 3040. The ring resonator type laser is prepared in a manner as described below.

Figure 25:
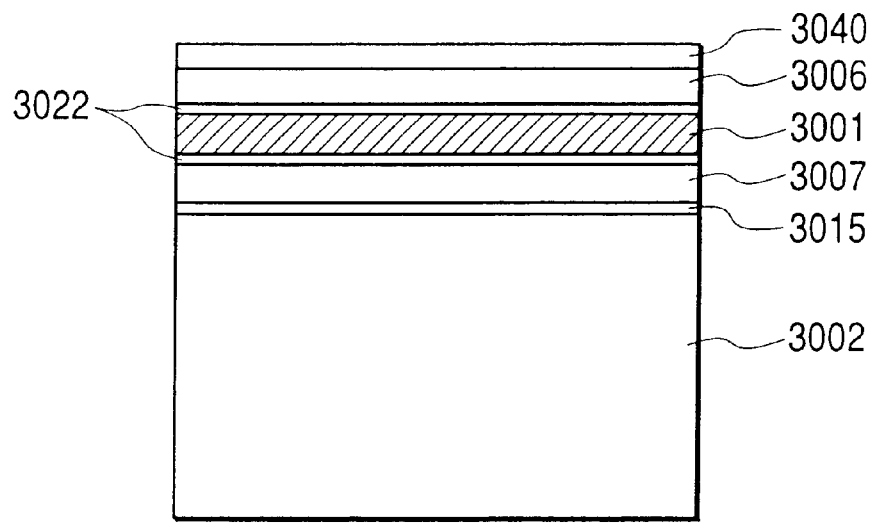
FIG. 25 is a schematic cross sectional view of a ring resonator type semiconductor laser, illustrating a manufacturing step thereof.
Figure 26:
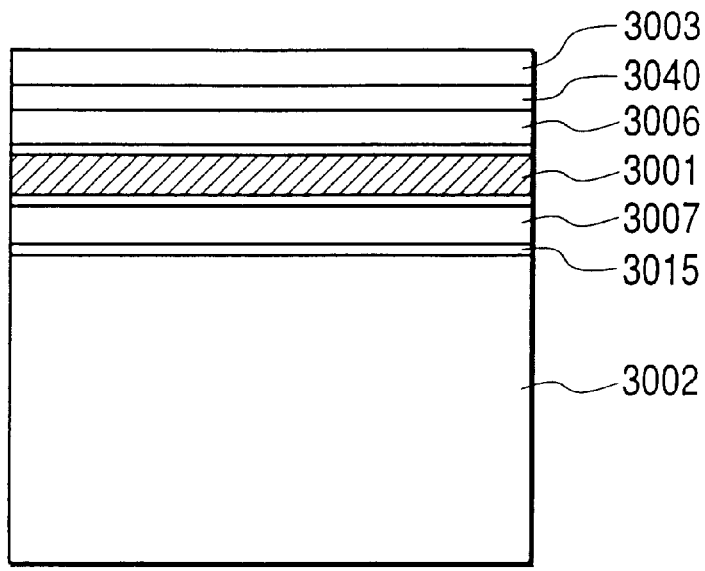
FIG. 26 is another schematic cross sectional view of the ring resonator type semiconductor laser of FIG. 25, illustrating another manufacturing step thereof.
Figure 27:
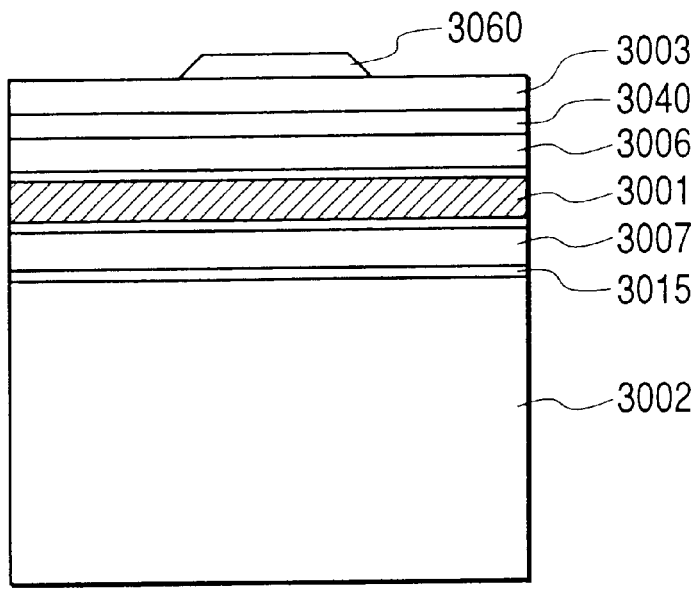
FIG. 27 is still another schematic cross sectional view of the ring resonator type semiconductor laser of FIG. 25, illustrating still another manufacturing step thereof.
Figure 28:
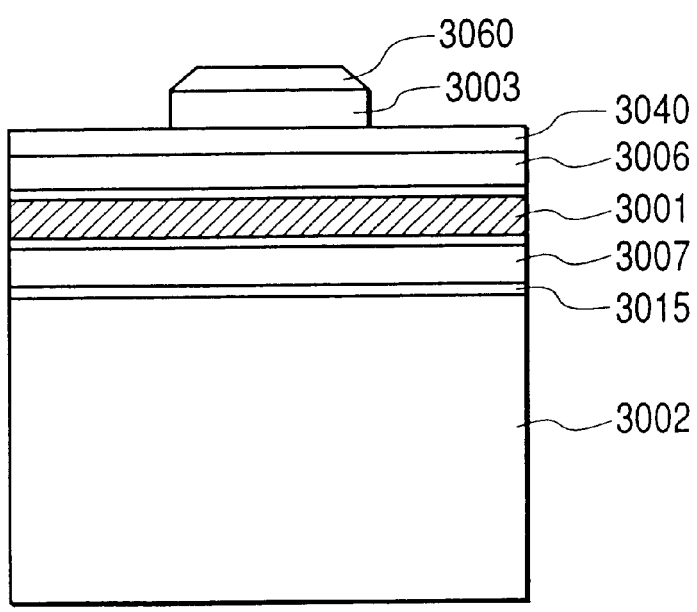
FIG. 28 is still another schematic cross sectional view of the ring resonator type semiconductor laser of FIG. 25, illustrating still another manufacturing step thereof.
Figure 29:
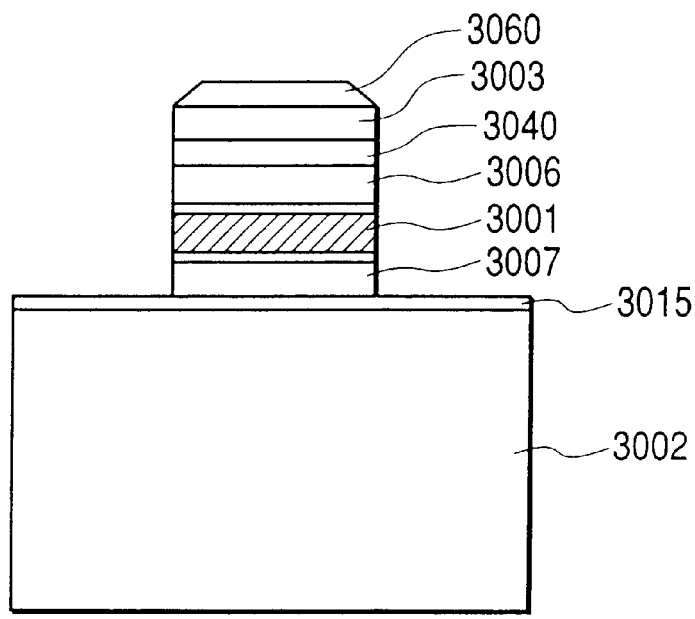
FIG. 29 is still another schematic cross sectional view of the ring resonator type semiconductor laser of FIG. 25, illustrating still another manufacturing step thereof.
Figure 30:
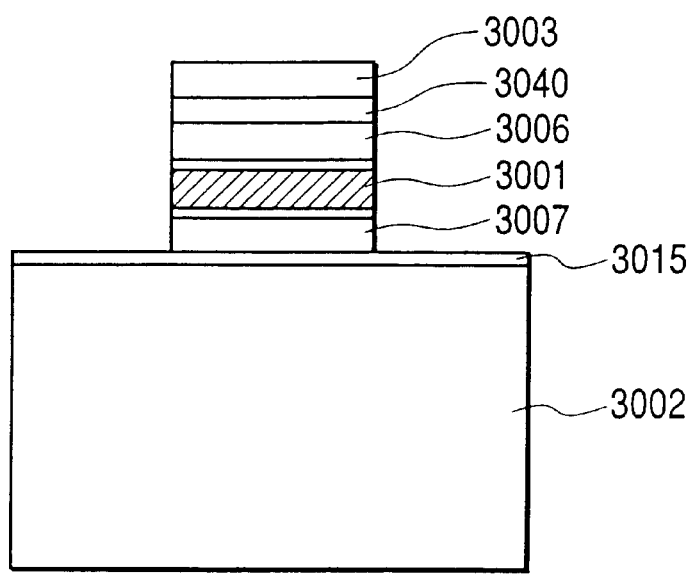
FIG. 30 is a schematic cross sectional view illustrating a ring resonator type semiconductor laser according to the invention.

Firstly, a base structure having a configuration as shown in FIG. 25 is prepared. It comprises an nGaAs substrate 3002, an active layer 3001 having a multiple quantum well structure of three layers of $Al_{0.3}Ga_{0.7}As/GaAs$ arranged on the substrate 3002, a pair of $Al_{0.3}Ga_{0.7}As$ guiding layers 3022 sandwiching the active layer 3001 and a pair of cladding layers 3006 and 3007 sandwiching the above layers (of which the layer 3006 is made of p-$Al_{0.5}Ga_{0.5}As$ and the layer 3007 is made of n-$Al_{0.5}Ga_{0.5}As$). Reference numeral 3015 denotes an n-GaAs buffer layer. Reference numeral 3040 denotes a p-GaAs cap layer. Then, a Cr/Au (or Ti/Pt/Au) layer is formed on the cap layer 3040 for the anode 3003 (FIG. 26). After applying a photoresist 3060, it is subjected to a patterning operation to show a profile as shown in FIG. 27. Then, the layer of the anode 3003 is subjected to a dry etching process, using the patterned photoresist as mask (FIG. 28). Subsequently, the underlying semiconductor layers are dry-etched (FIG. 29) and the photoresist is removed (FIG. 30). Then, the anode is annealed in an hydrogen atmosphere for alloying.

Figure 31:
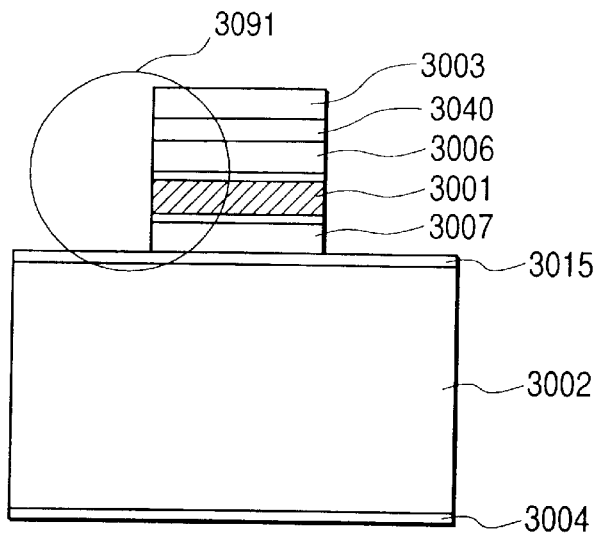
FIG. 31 is a schematic cross sectional view illustrating another ring resonator type semiconductor laser according to the invention.

Then, if necessary, the substrate is polished and the cathode 3004 of AuGeNi/Au is produced by evaporation (FIG. 31). Then, it is annealed again in a hydrogen atmosphere for alloying.

Figure 32:
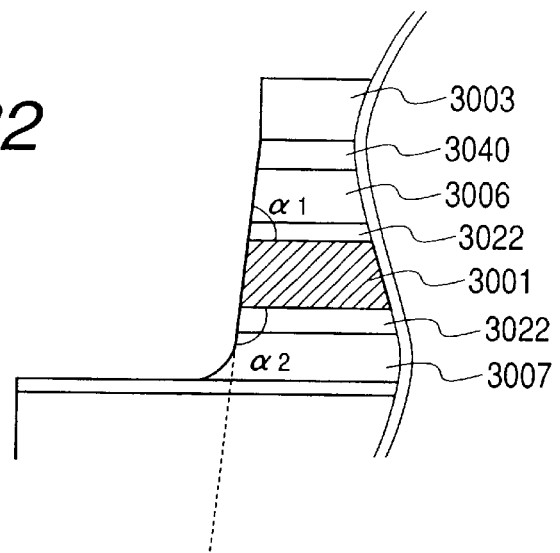
FIG. 32 is a schematic cross sectional view of a gyro comprising a ring resonator type semiconductor laser according to the invention.

FIG. 32 is an enlarged schematic view of the encircled area 3091 in FIG. 31. As seen from FIG. 32, the angles $\alpha_1$ and $\alpha_2$ between the corresponding lateral surfaces of the low refractive index layers 3006 and 3007 sandwiching the active layer 3001 and the surface of the active layer 3001 satisfy the requirement of $75° \leq \alpha_1, \alpha_2 \leq 105°$. In an experiment, values of $\alpha_1=89.0°$ and $\alpha_2=88.0°$ were obtained. In this way, a gyro comprising a ring resonator type semiconductor laser was prepared.

Each of the edges of the laser was 400 $\mu$m long and the oscillation threshold value of the unit was 4 mA. Then, the ring laser was driven to rotate at a rate of 30° per second that may be caused by a camera shake or a moving automobile, a signal with a voltage amplitude of 100 mV and a frequency of 862 Hz was obtained from the electrode terminal 3005.

For the purpose of comparison, semiconductor lasers with various different angles $\alpha_1$ and $\alpha_2$ between the corresponding lateral surfaces of the upper and lower cladding layers and the surface of the active layer 3001 were prepared. A beat signal was obtained when the the requirement of $75° \leq \alpha_1, \alpha_2 \leq 105°$ was satisfied and the ring laser was driven to rotate at a rate of 30° per second with a driving current of 5 mA or less.

However, no signal was obtained when the angles between the surfaces of the active layer and the corresponding lateral surfaces of the low refractive index layers exceeded 90°±15°. In this specification, the expression "low refractive index layers" refers to cladding layers, however they may also contain guiding layers.

The angle $\beta$ in FIG. 23 is 45°±0.01°, preferably 45°±0.001°. This definition is applicable to the angles of the other corners. This is a requirement to be indispensably met in order for a laser beam to come back to a point that is close to the starting point as much as possible after making a full turn through the resonator. It may be needless to say that the angle $\beta$ should meet the above requirement when the semiconductor ring laser is prepared by way of some other process.

Figure 33:
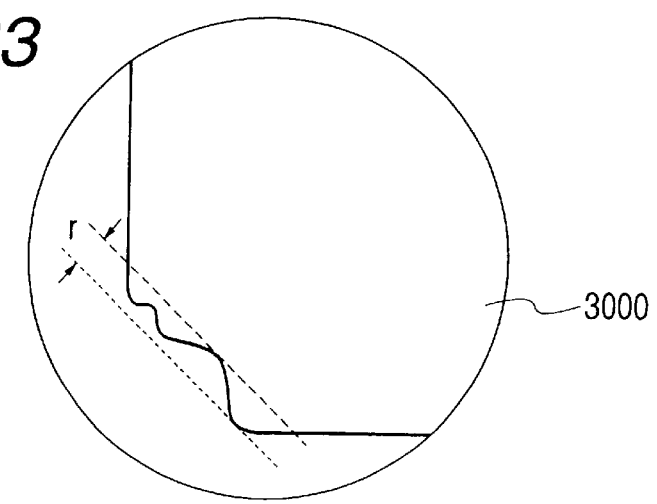
FIG. 33 is an enlarged schematic partial plan view of a gyro comprising a ring resonator type semiconductor laser according to the invention.
Figure 34:
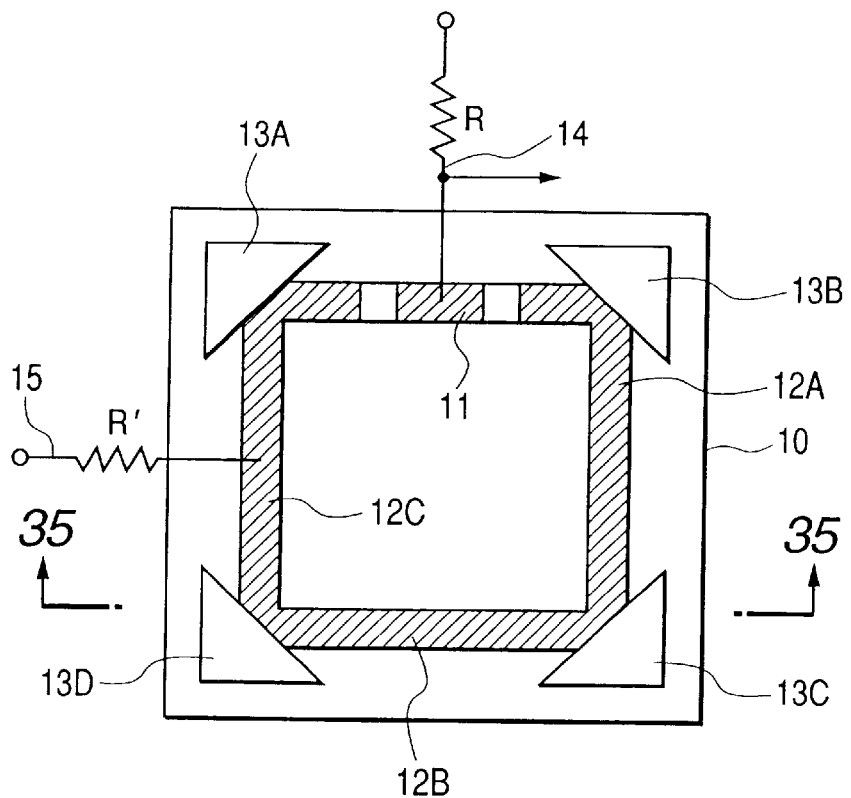
FIG. 34 is a schematic plan view of a known gyro.
Figure 35:
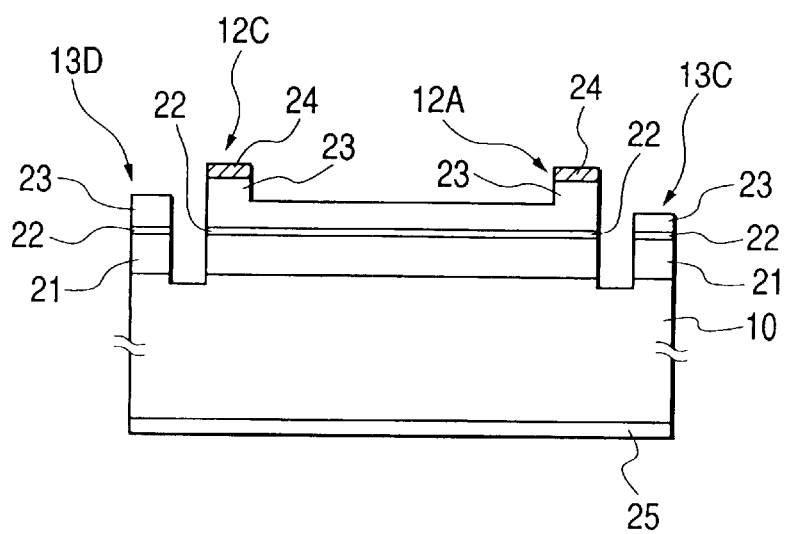
FIG. 35 is a schematic cross sectional view of the gyro of FIG. 34 taken along line 35—35 in FIG. 34.

FIG. 33 is an enlarged schematic view of the corner 3090 in FIG. 23. The surface roughness r of the corner should be preferably less than 200 Å.

As described above, according to a first aspect of the invention, there is provided a gyro comprising a ring resonator type semiconductor laser for having laser beams transmitted circularly in opposite senses relative to each other, where the angles formed by the surface of the active layer of the semiconductor laser and the lateral surfaces of the low refractive index layers are controlled to detect the beat signal accompanying the rotation with a reduced loss of light.

What is claimed is:

1. A gyro, comprising:

a ring resonator type semiconductor laser for having laser beams transmitted circularly in opposite directions relative to each other, said ring resonator type semiconductor laser including an active layer having a horizontal surface, and a pair of lower refractive index layers with a refractive index lower than said active layer and sandwiching said active layer, wherein the horizontal surface of said active layer and a lateral surface of each of said lower refractive index layers form an angle $\alpha$ satisfying the requirement of $75°<\alpha<105°$ over the entire periphery of said lower refractive index layers;

signal detection means for detecting a beat signal generated by rotation of the gyro; and a driving source driving said laser, with said driving source having a laser oscillation frequency modulated in a frequency band different from the beat signal.

2. A gyro according to claim 1, wherein the beat signal is detected by said signal detecting means as a change in the electric current, the voltage or the impedance.

3. A gyro according to claim 1, wherein the beat signal is detected by said signal detecting means as a frequency change in the electric current flowing through said semiconductor laser, the voltage applied to said semiconductor laser or the impedance of said semiconductor laser.

4. A gyro according to claim 1, wherein said signal detection means is an electric current detecting circuit, a voltage detecting circuit or an impedance detecting circuit.

5. A gyro according to claim 1, wherein said signal detection means includes a frequency/voltage converter or a frequency counter.

6. A gyro according to claim 1, wherein said active layer has a thickness of not greater than 2 μm.

7. A gyro according to claim 1 or 2, wherein the angle $\alpha$ formed by the horizontal surface of said active layer and the lateral surfaces of said low refractive index layers satisfies the requirement of $85°<\alpha<95°$.

8. A gyro according to claim 1 or 2, wherein said ring resonator type semiconductor laser has a cylindrical pillar-like profile or a triangular pillar-like profile.

9. A gyro according to claim 1 or 2, wherein the surface precision of the lateral surfaces of said low refractive index layers is less than ½ of the wavelength of the laser beams in said active layer.

10. A gyro according to claim 1, wherein said low refractive index layers are cladding layers sandwiching said active layer.

11. A gyro according to claim 1, wherein said low refractive index layers are guiding layers and cladding layers sandwiching said active layer.

12. A gyro according to claim 1, wherein said ring resonator type semiconductor laser produces a seeping evanescent light, with no reflector existing within reach of the seeping evanescent light.

13. A gyro according to claim 1, wherein said active layer is made of GaAs, AlGaAs, InP or InGaAsP.

14. A method of operating a gyro comprising a ring resonator type semiconductor laser including an active layer having a horizontal surface and a pair of lower refractive index layers each having a lateral surface, with the index layers having a lower refractive index than the active layer, said method comprising the steps of:

providing the horizontal surface of the active layer and the lateral surfaces of the index layers to form an angle $\alpha$ satisfying the requirement of $75°<\alpha<105°$ over the entire periphery of the lower refractive index layers;

detecting a beat signal of the laser; and driving the laser with a driving source having a laser oscillation frequency modulated in a frequency band different from the beat signal.

15. A method of operating a gyro according to claim 14, wherein the voltage or the electric current for driving the ring resonator type semiconductor laser is modulated in a frequency not found in the frequency band of the beat signal.

16. A method of operating a gyro according to claim 14, wherein a piezoelectric element is used to drive the ring resonator type semiconductor laser to rotate clockwise or counterclockwise.

17. A gyro, comprising:

a ring resonator type semiconductor laser for having laser beams transmitted circularly in opposite directions relative to each other, said ring resonator type semiconductor laser including an active layer having a horizontal surface, and a pair of lower refractive index layers with a refractive index lower than said active layer and sandwiching said active layer, wherein the horizontal surface of said active layer and a lateral surface of each of said lower refractive index layers form an angle $\alpha$ satisfying the requirement of $75°<\alpha<105°$ over the entire periphery of said lower refractive index layers;

a terminal for detecting a beat signal; and a driving source driving said laser, with said driving source having a laser oscillation frequency modulated in a frequency band different from the beat signal.

* * * * *

UNITED STATES PATENT AND TRADEMARK OFFICE
CERTIFICATE OF CORRECTION

PATENT NO. : 6,493,089 B1  Page 1 of 1
DATED : December 10, 2002
INVENTOR(S) : Takahiro Numai It is certified that error appears in the above-identified patent and that said Letters Patent is hereby corrected as shown below:

Title page,
Item [56], References Cited, U.S. PATENT DOCUMENTS, "4,327,982 A" should read -- 4,327,962 A --.
FOREIGN PATENT DOCUMENTS, "60-148185  8/1995" should read -- 60-148185  8/1985 --.

Column 4,
Line 40, "Af" should read -- $\Delta f$ --.

Column 7,
Line 33, "semidon-" should read -- semicon- --.

Column 10,
Line 43, "$C_2>>C_1$" should read -- $C_2>C_1$ --.

Column 11,
Line 19, "layer) AlGaAs" should read -- layer)/AlGaAs -- and "ALGaIP" should read -- ALGaInP --.
Line 20, "AlGaIP" should read -- AlGaInP --.

Column 14,
Line 7, "nGaAs" should read -- n-GaAs --.
Line 49, "the the" should read -- the --.

Signed and Sealed this

Fifth Day of August, 2003

JAMES E. ROGAN
*Director of the United States Patent and Trademark Office*